United States Patent [19]
Zur

[11] Patent Number: 5,285,157
[45] Date of Patent: Feb. 8, 1994

[54] REDUCTION OF TRUNCATION CAUSED ARTIFACTS

[75] Inventor: Yuval Zur, Haifa, Israel

[73] Assignee: Elscint Ltd., Haifa, Israel

[21] Appl. No.: 874,103

[22] Filed: Apr. 27, 1992

[51] Int. Cl.$^5$ .............................................. G01R 33/20
[52] U.S. Cl. .................................... 324/309; 324/307
[58] Field of Search .............. 324/300, 307, 309, 310, 324/311, 312, 313, 314, 318, 322; 128/653.2, 653.5

[56] References Cited

U.S. PATENT DOCUMENTS

| | | | |
|---|---|---|---|
| 4,888,522 | 12/1989 | Weingart | 315/111.61 |
| 4,950,991 | 8/1990 | Zur | 324/307 |
| 4,973,111 | 11/1990 | Haacke et al. | 324/309 |

OTHER PUBLICATIONS

"The Fourier Transform and its Application" by R. Bracewell. published by McGraw Hill (1965) pp. 209 et seq.
"Digital Filters" by R. W. Hamming, published by Prentice Hall, Inc., at 171 et seq, (1983).

Primary Examiner—Michael J. Tokar
Attorney, Agent, or Firm—Sandler, Greenblum and Bernstein

[57] ABSTRACT

Elimination of truncation artifacts in Magnetic Resonance Images is accomplished by analaytically optimizing controllable parameters; i.e., filter characteristic and assymetry ratio when asymetrically sampling arid time domain filtering followed by complex conjugating the filtered data to reduce the Gibbs artifact.

11 Claims, 4 Drawing Sheets

Symmetrical Sampling:
no. of PTS (Ns)
= N1 + N2/2

Asymmetrical Sampling
no. of PTS (NA) = N1+N2
$N_S = N_A (1-R)$ $R = \dfrac{N_A - N_S}{N_A} = \dfrac{N2/2}{N_A}$ $fa = \dfrac{\alpha}{\pi}$

REDUCTION OF TRUNCATION CAUSED ARTIFACTS

FIELD OF THE INVENTION

This invention is concerned with imaging using Fourier transforms such as in magnetic resonance imaging (MRI) systems and more particularly with the reduction of Gibbs truncation-caused artifacts in such images. This invention represents an improvement over the invention of U.S. Pat. No. 4,950,991 (Israeli Patent Application 86570).

BACKGROUND OF THE INVENTION

Sharp transitions in the image cannot be well represented by time domain data which is sampled for a finite amount of time. Since real data must be truncated at some point in time, any discontinuity in the image will include an overshoot which is 9% of the magnitude of the discontinuity. This overshoot appears as "ringing" in the image. This ringing near sharp transitions is often referred to as the "Gibbs artifact" after Josiah W. Gibbs. Gibbs noted that with more coefficients the value of the overshoot in using the Fourier series does not diminish. However, the error (i.e., the overshoot) becomes confined to a region that shrinks around the discontinuity as the sampling time is increased. This causes the artifact to become less prominent.

Accordingly, the size of the sampling window used in obtaining the imaged data is increased, the amplitude of the overshoot remains the same, but the overshoot is compressed towards the edge of the discontinuity. However, taking more sampling points requires more time which reduces throughput. Also, as is well known, the signal-to-noise ratio (SNR) is proportional to the inverse of the square root of N where N is the number of sampling points used. Thus, taking more sampling points reduces the SNR while improving the spatial resolution.

In magnetic resonance image contrast resolution is often preferred over spatial resolution. Thus, reduced sampling in the phase encoding direction which reduces acquisition time should be preferred; especially since in the time saved the SNR could be improved by averaging several measurements. However, in the past the reduced sampling increased the ringing artifact cancelling any benefits of the improved SNR. Thus, until the invention U.S. Pat. No. 4,950,991, imaging experts have been reluctant to use low resolution images because of the increased Gibbs artifact.

The U.S. Pat. No. 4,950,991 uses a multiplicative filter in the time domain to reduce the amplitude of the overshoot and increase the SNR. The filter is used in conjunction with asymmetrical sampling and complex conjugation. The asymmetrical sampling and complex conjugation increases the spatial resolution based on a given number of actual sampling points. The filter reduces the spatial resolution of the image. However, the reduction in the spatial resolution of the filter is offset in the patent by the increase in spatial resolution afforded by the use of asymmetrical sampling and complex conjugation. Thus, the previously mentioned patent obtained a reduction in Gibbs artifact without adversely affecting the spatial resolution, the SNR or the scan time. It has now been found that the suppression of the ringing or truncation artifacts can be further improved and with no adverse effect on the resolution, the SNR or the scan time.

The improvement herein comprises the means and methods for optimizing the selection of system controllable parameters, i.e., the filter characteristics and the asymmetry of the sampling.

The above mentioned and other features and objects of the present invention will be best understood when considered in the light of the following description of a broad aspect of the present invention taken in conjunction with the accompanying drawings, wherein.

Figure 5:
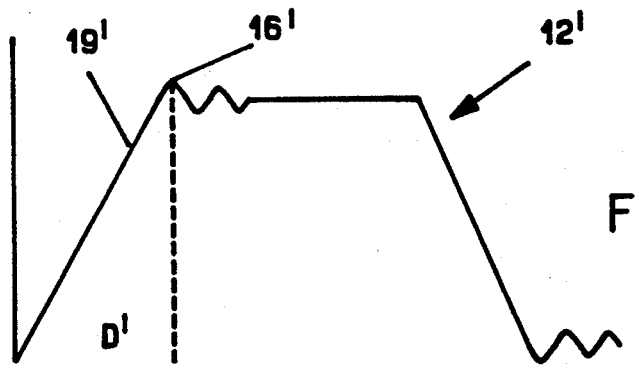
Figure 8:
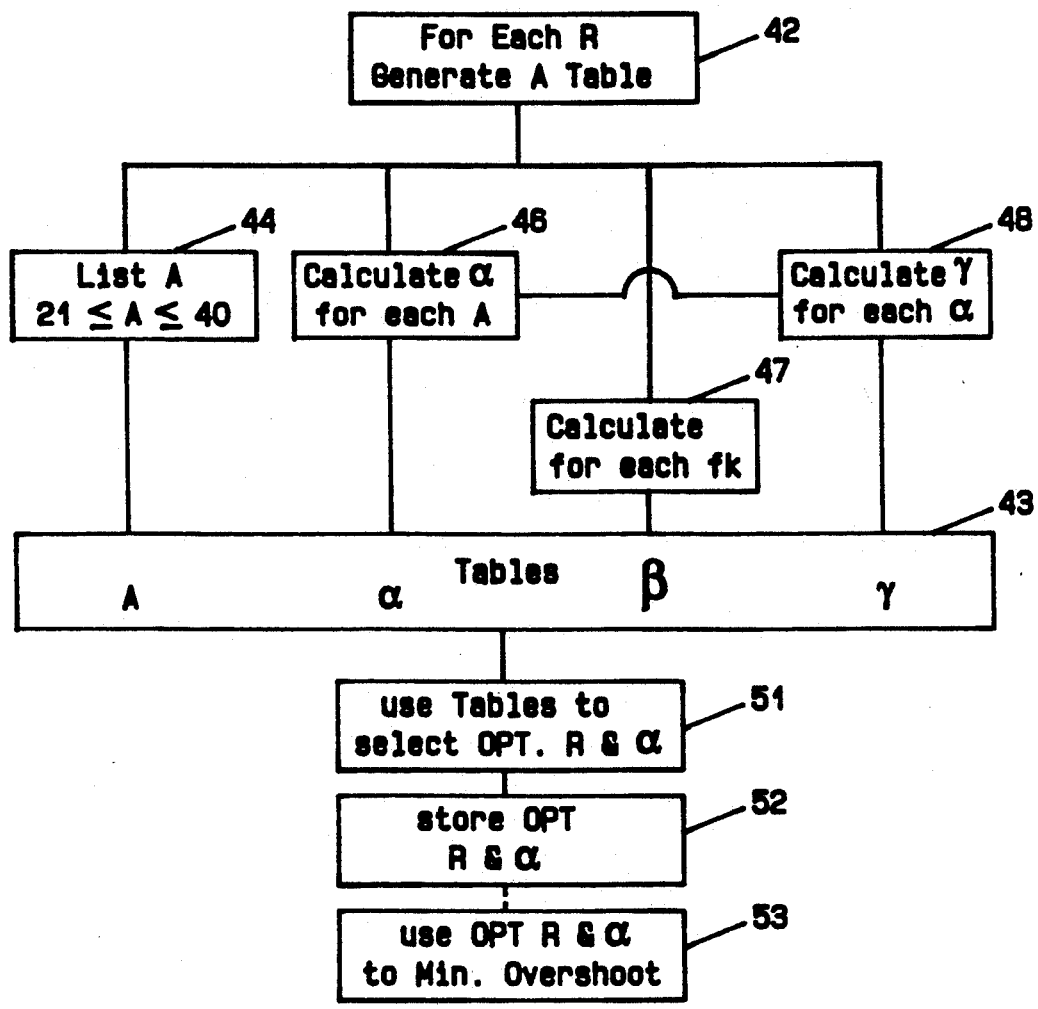
Figure 6:
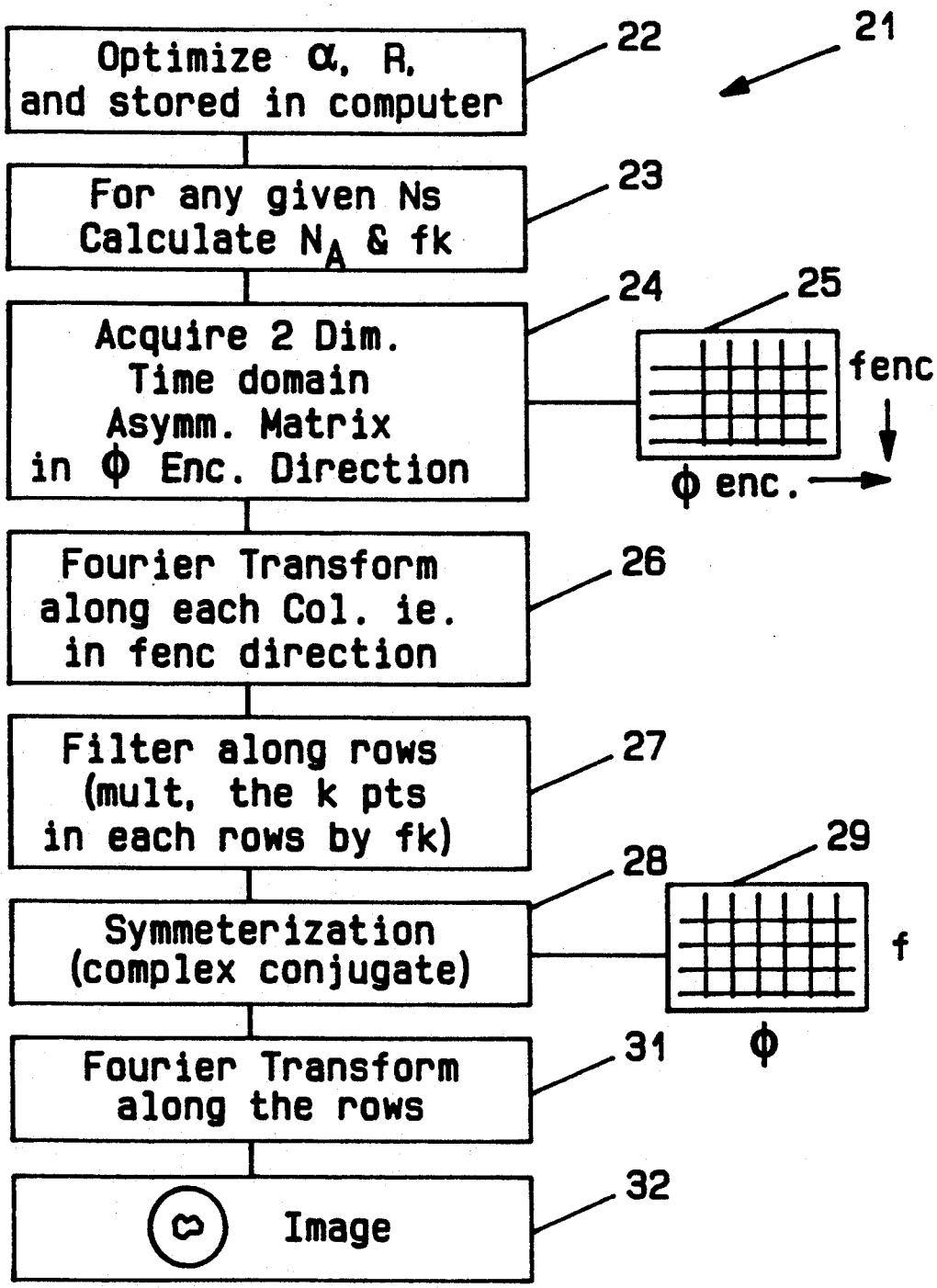
Figure 7:
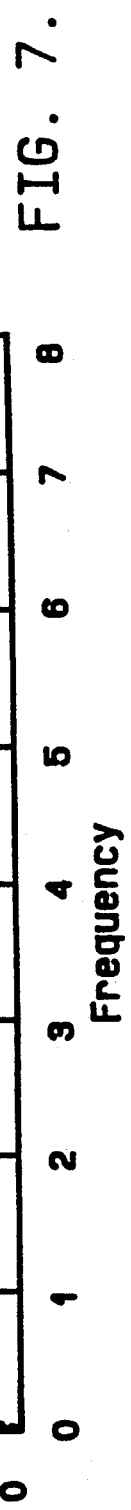

FIG. 5 illustrates the suppressed overshoot in the frequency domain obtained from a filtered Fourier transformed truncated time signal, FIG. 6 shows a flow chart including unique steps used in the MRI system described herein, FIG. 7 shows half of the step response of the system according to the prior art old method using symmetrical sampling and no filter and according to the method of this invention (new method), and FIG. 8 is a flow chart showing details of the first block of the flow chart of FIG. 6.

GENERAL DESCRIPTION

Figure 1:
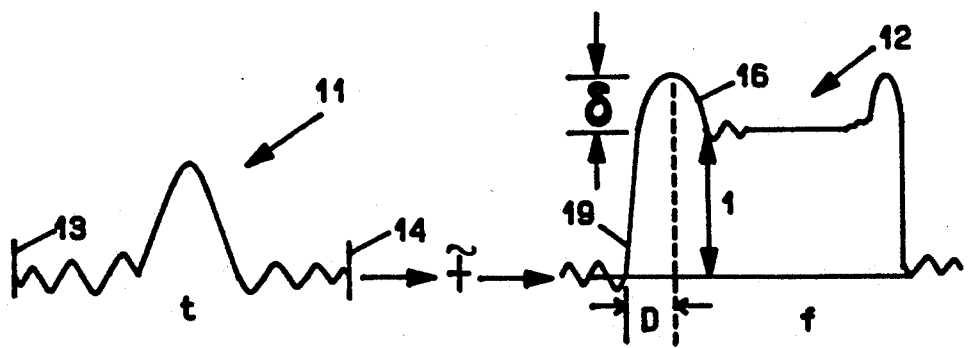
FIG. 1 illustrates an overshoot in a frequency signal obtained from a Fourier transformed truncated time signal.

In FIG. 1 the drawing shows a typical FID signal 11 acquired in the time domain. As indicated by the stylized "F" the acquired time domain signal, which in a preferred embodiment is an echo signal, is Fourier transformed into a frequency domain signal 12.

Note that the time domain signal 11 does not go from minus infinity to plus infinity, but instead is truncated as indicated by lines 13 and 14 defining the limits of the time domain signal 11. The truncation of the time domain signal results in the overshoot 16 ($\delta$ above the level shown as a normalized 1) which appears in the frequency domain signal 12. This overshoot causes the Gibbs or truncation artifact; i.e., a blurring or ringing to appear in the image.

In the past, the Gibbs artifact was often countered by sampling a greatly increased number of points to confine the frequency displacement of the overshoot to a narrow region around the discontinuity. However, the throughput time and the SNR of the system suffered due to the increased number of sampling points. The decrease in SNR also offsets any advantages of the improved image resolution.

In the prior art the Gibbs artifact also predicated against acquiring images with fewer sampling points such as taught in U.S. Pat. No. 4,888,522 (assigned to the Assignee of this invention) because of the resulting ringing artifacts which obscured the images.

Figure 2:
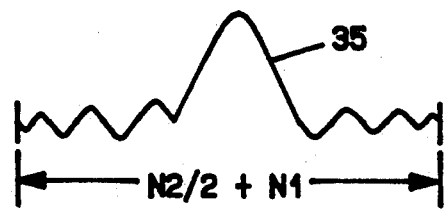
FIG. 2 illustrates symmetrical sampling.
Figure 3:
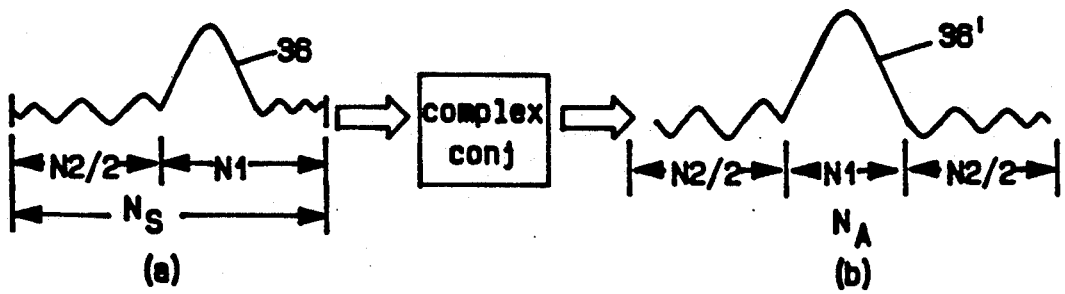
FIG. 3a illustrates asymmetrical sampling.
FIG. 3b illustrates "symmetrization" of the asymmetrical sampling.

The effective number of sampling points is increased herein by asymmetric sampling and complex conjugation without increasing the time necessary for the sampling. This increase in effective sampling points is illustrated in FIGS. 2 and 3. FIG. 2 shows the normal symmetrical sampling of signal 35 wherein N. points are sampled and where:

$$N_{32} = N1 + N2/2 \text{ points} \quad (1)$$

FIG. 3a shows the same number $N_Z$ points on signal 36 sampled asymmetrically. As shown in FIG. 3b, by complex conjugation the number of sampling points on signal 36' is increased to $N_A$. The ratio of asymmetry R is the increase in the number of sampling points due to complex conjugation divided by total number of points; or:

$$R = (N_A - N_Z)/N_A = (N2/2)/N_A, \text{ and;} \quad (2)$$

$$N_Z = N_A(1-R) \quad (3)$$

Note that the ratio R is positive and less than one half.

For example, if: $N_S = 128$, $N1 = 78$ and $N2/2 = 50$; then, $N_A$ would be 178 and R would be 0.28.

Figure 4:
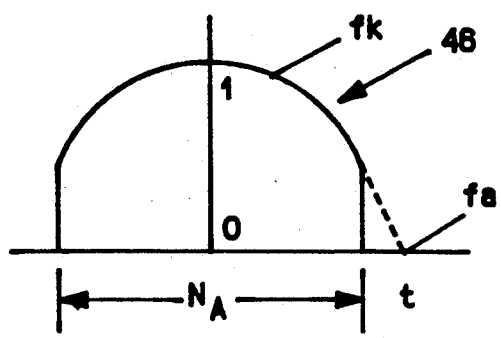
FIG. 4 illustrates a preferred type of filter in the time domain for use in the inventive system.

A Kaiser filter (see the book "Digital Filters" by R. W. Hamming, published by Prentice Hall, Inc., at pp. 171 et seq) as shown in FIG. 4, peaks at unity on the zero ordinate. It should be understood that while the Kaiser type filter Is described herein, other filter types can be used. An Important characteristic of any selected filter is that substantially only the center of the acquired data passes unattenuated through the filter.

FIG. 5 shows the effect on the frequency domain signal of the time domain multiplicative filter. Note that the signal 12' has a sharply reduced Gibbs overshoot 16' compared to the overshoot 16 of FIG. 1. The line 19' in FIG. 5, which defines the edge of the signal, is slanted more as compared to the substantially perpendicular line 19 in FIG. 1. In actual practice, the line 19 is transformed from having a transitional width D of one unit to having a transitional width D' larger than the one unit. However, in this invention the effective total sampling window is increased by $1/(1-R)$ as shown above, so that the overall transition width at the discontinuity is unchanged, while the overshoot amplitude 16' in FIG. 5 remains significantly reduced compared to 16 in FIG. 1.

The unique flow chart 21 of an MRI system is shown in FIG. 6. The steps of the flow chart enable the MRI system to improve the reduction of the Gibbs artifact over the reduction of the U.S. Pat. No. 4,950,991 without any significant consequent adverse effects on SNR resolution or imaging time. The MRI system uses system components such as described in U.S. Pat. No. 4,950,991.

In this method of reducing the truncation caused artifacts there are two free parameters, the asymmetry ratio R and the filter characteristic $\alpha$. The optimum values $R_{opt}$ and $\alpha_{opt}$ are obtained once and stored in the MRI system computer-controller. When the system is used for scanning a patient, the number of points $N_s$ used in the scan is given. Using the stored values $R_{opt}$ $\alpha_{opt}$ and the given $N_s$, the total number of points $N_A$ and the filter values for each of the $N_A$ points $f_k$ (where $k = -(N_A-1)/2 \ldots 0 \ldots +(N_A-1)/2$ and $f_k = 1$ for $k = 0$) are (block 23).

Using the $R_{opt}$ and the given $N_Z$, an asymmetrical two-dimensional time domain matrix of data is acquired as indicated by block 24. The acquired matrix is indicated at block 25. In block 25 the phase encoding data is along the rows and the frequency encoding data is along the columns. According to the invention the truncation artifact reduction can be implemented along either the phase encoding or the frequency encoding direction. Usually it is implemented along the phase encoding direction to shorten the scan time. Then, the acquired data is Fourier transformed along the frequency encoding direction (block 26). The transformed data is then filtered by multiplying the k points in each row by $f_k$ (block 27). The filtered data is "symmeterized" by complex conjugation along the rows (block 28). This step raises the number of obtained points from $N_Z$ to $N_A$ as indicated in block 29. The "symmeterization" increases the resolution without increasing throughput time.

The symmeterized data is then Fourier transformed along the rows (block 31) to provide image data for the display image (block 32). The image has approximately the same resolution and SNR as would be obtained without filtering and with symmetrical sampling. However, the overshoot is drastically reduced.

The fact that the same resolution is obtained is graphically demonstrated in FIG. 7 which compares a half of a system step response (with a sampling window of one unit) using the old method and using the new method. The old method uses symmetrical sampling and no filtering while the new method comprises asymmetrical sampling, complex conjugation and filtering. The slope of the curve at 19 (old method) and at 19' (new method) are the same. Thus, the resolution of the old method and the new method are the same. However, as shown in FIG. 7, the overshoot with the new method is drastically reduced.

When the asymmetrical sampling is done in the frequency encoding direction, the optimal asymmetry ratio $R_{opt}$ is used to set the sampling time for the asymmetric sampling. The asymmetrically sampled data is then Fourier transformed in the phase encoding direction. The output of the Fourier transformed data is filtered; i.e., multiplied by $f_k$. A complex conjugation is then done on the filtered data to increase the sampled points by $N_Z/2$. The complex conjugated data is then Fourier transformed in the frequency encoding direction (block 38) to provide the image of block 39.

This image also has drastically decreased overshoot while the resolution and signal-to-noise ratio remain practically the same as obtained using the old method.

The analytical relationships for obtaining the optimal imaging parameters $\alpha_{opt}$ and $R_{opt}$ are as follows:

With the new imaging method, the mean square of the noise in the image, $\sigma^2$, is proportional to:

$$\sigma^2 \propto \sum_{N_1} |f_k|^2 + 4 \sum_{N_{2/2}} |f_k|^2 = \sum_{N_A} |f_k|^2 + 2 \sum_{N_{2/2}} |f_k|^2 \quad (4)$$

The noise from the $N_1$ sample points is noise from single uncorrelated points while the noise from the complex conjugated points is noise coming from $N_Z/2$ uncorrelated pairs. However, the noise within each pair is completely correlated.

Similarly, the mean squre of the noise which is obtained by sampling $N_Z$ uncorrelated unfiltered points is proportional to:

$$\sigma^2 \alpha'' N_Z \quad (4a)$$

The SNRi obtained by the unique imaging method described herein compared to the SNRp normally obtained by symmetrically sampling $N_Z$ points is, therefore, given by:

$$\frac{SNR_i}{SNR_p} = \beta = \left[ \frac{N_s}{\sum_{N_A} |f_k|^2 + 2 \sum_{N_{2/2}} |f_k|^2} \right]^{\frac{1}{2}} \quad (5)$$

where $\beta$ in equation (5) is a function of $\alpha$ and R. Therefore, we must select $\alpha$ and R such that $\beta \geq 1$, and the images we obtain using our new imaging method have the same SNR as the conventional prior art images.

In this description, the time domain filter used is a Kaiser filter which is a good filter for decreasing the Gibbs artifact.

For the Kaiser filter, $f_k$ given by $$f_k = \begin{cases} \frac{I_0[\alpha \sqrt{1 - (2k/N_A)^2}]}{I_0(\alpha)} & |k| < N_A/2 \\ 0 & |k| > N_A/2 \end{cases} \quad (6)$$

where:

$I_O$ is the zero order modified Bessel function,
$\alpha$ is the parameter of the filter that controls its shape and, therefore, the amplitude of the overshoot.

If the total sampling window of the time domain filter in equation (6) is one time unit, the Fourier Transform $F_T$ for the Kaiser filter is:

$$F_T(f) = \frac{\text{Sinh}[\alpha \sqrt{1 - (f/f_a)^2}]}{\alpha I_0(\alpha) \sqrt{(f/f_a)^2 - 1}} \quad (7)$$

where
$f_Z = \alpha/\pi$, f is frequency, and
$I_O$ is the zero order modified Bessel function.

The step response $S_f(f)$ of the filter in the image domain for a sampling window of one time unit is:

$$S_f(f) = 2 \int_0^f F_T(f') df' \quad (8)$$

where: $F_T(f')$ is given by equation (7). See "The Fourier Transform and its Application" by R. Bracewell published by McGraw Hill (1965) pp. 209 et seq.

The step response $S_p(f)$ in the image domain of the unfiltered data can similarly be calculated for a sampling window of one time unit, using equation (8).

$$S_p(f) = 2 \int_0^f \frac{\sin(\pi f')}{(\pi f')} df' \quad (9)$$

where $\sin(\pi f')/\pi f'$ is the Fourier transform of a square window of unit time.

The step response $S_f(f)$ is calculated for any $\alpha$. The transition width D' (see FIG. 5) is defined as the frequency width required for the step response to rise from 10%–90% of the step. From $S_f(f)$, the value of D' is evaluated for each $\alpha$. The same frequency width $D_O$ is calculated for the non-filtered prior art data from $S_p(f)$. The relative frequency width of the step response of the new method as compared to the old method is given by:

$$\text{relative width of step response} = \gamma = \frac{D'}{D_o} (1 - R) \quad (10)$$

$D'/D_O$ is multiplied by $(1-R)$, because the sampling window of the prior art acquisition is shorter by a factor of $(1-R)$ than the sampling window of the new imaging method. The value of $\gamma$ in equation (9) must be close to 1, in order to obtain the same resolution in both methods.

The ratio $\delta$ between the peak amplitude of the overshoot and the height of the discontinuity is defined in FIG. 1. This ratio depends on the filter parameter $\alpha$, and can be obtained by calculating the step response $S_f(f)$ in equation (8). Kaiser (see Hamming "Digital Filters", p. 174) found an empirical equation that relates the filter parameter $\alpha$, with $\delta$. If we define A to be the ringing overshoot in decibels, then:

$$A = -20 \log_{10} \delta \quad (11)$$

According to Kaiser's equation:

$$\alpha = 0.5842(A-21)^{0.40} + 0.07886(A-21) \quad 21 \leq A \leq 50 \quad (12)$$

Using equation 12, $\alpha$ can be calculated for each A. Note that for $\alpha = 0$, we obtain A=21 db or $\delta = 0.09$ which is the value for the unfiltered data.

The optimization is carried out as shown in FIG. 8. For each value of R (0 R 0.5) (block 42) a table (block 43) is generated. In each table the value of A is valued between 21 and 50 db (block 44). The filter characteristic $\alpha$ (block 46) is calculated using equation (12). The relative SNR, ($\alpha$) (block 47) is calculated using equation (5). The relative step response (block 48) is calculated by using equation (10). In this manner for each R an optimal $\alpha$ ($\alpha_{opt}$) is selected, where both $\beta$ and are approximately 1. Once all the tables are generated for all Rs, the optimal R, $R_{opt}$, is used for which $\alpha_{opt}$ corresponds to the largest value of A. In this way the largest attenuation of Gibbs artifact is obtained, while the SNR and step response width are unchanged.

For example, the following table was generated for R=0.28 and attenuations A ranging from -22 to -40 db. For this R, the optimal $\alpha$ is approximately 2.52, which corresponds to A=33.

TABLE 1

| db Atten. A | $\alpha$ | Relative SNR $\beta$ | Relative width of step response $\gamma$ |
|---|---|---|---|
| 22.0 | 0.6631 | 0.7088 | 0.7415 |
| 23.0 | 0.9286 | 0.7358 | 0.7672 |
| 24.0 | 1.1432 | 0.7622 | 0.7944 |
| 25.0 | 1.3326 | 0.7880 | 0.8216 |
| 26.0 | 1.5064 | 0.8131 | 0.8472 |
| 27.0 | 1.6694 | 0.8376 | 0.8744 |
| 28.0 | 1.8244 | 0.8840 | 0.9000 |
| 29.0 | 1.9730 | 0.9060 | 0.9256 |
| 30.0 | 2.1166 | 0.9271 | 0.9512 |
| 31.0 | 2.2560 | 0.9473 | 0.9768 |
| 32.0 | 2.3919 | 0.9667 | 1.0008 |
| 33.0 | 2.5248 | 0.9854 | 1.0248 |
| 34.0 | 2.6550 | 1.0033 | 1.0488 |
| 35.0 | 2.7829 | 1.0205 | 1.0712 |
| 36.0 | 2.9087 | 1.0370 | 1.0936 |
| 37.0 | 3.0327 | 1.0529 | 1.1160 |
| 38.0 | 3.1551 | 1.0682 | 1.1368 |
| 39.0 | 3.2759 | 1.0830 | 1.1592 |
| 40.0 | 3.3953 | 1.0655 | 1.1784 |

After calculating such tables for all Rs, the optimal R, $R_{opt}$, was found to be 0.28. With $\alpha_{opt}$ approximately 2.52, which corresponds to an attenuation A=33 db. This means that Gibbs artifact is reduced by 12 db or by a factor of 4, as compared to the prior art. These values are stored in the computer, and used to reduce truncation artifacts. The calculated step response of this optimal R and $\alpha$, together with the step response of the conventional prior art image, are shown in FIG. 7.

While the invention has been described using specific embodiments, it should be understood that such embodiments are by way of example only, and should not be Interpreted as limitations on the scope of the invention which is defined by the accompanying claims.

What is claimed is:

1. A method for improving an acquired magnetic resonance image (MRI) of an object by reducing overshoot in the image which is visible as a ringing artifact, said overshoot being caused by Fourier transforming, for a finite amount of time, data obtained by sampling a signal in the time domain at a number of sampling points, said signal containing frequency and phase information of said imaged object; said method comprising the steps of:
   a) choosing a filter having filter coefficients;
   b) analytically determining an optimized value of $\alpha$ which controls a filter characteristics, such as the shape of the filter, and an optimized value of R which is an asymmetrical sampling ratio in order to reduce the overshoot while maintaining the spatial resolution and signal-to-noise ratio (SNR) of the image without changing the number of sampling points, where R is equal to:

$$R = (N_A - N_S)/N_A = (N_Z/2)/N_A$$

wherein $N_A$ = total number of sampling points after complex conjugation to cause symmetrical sampling, and $N_S$ = total number of sampling points in asymmetrical sampling;
   c) asymmetrically sampling said acquired signals to obtain a two dimensional time domain matrix of data containing rows and columns;
   d) Fourier transforming the obtained data matrix along the column direction;
   e) filtering by multiplying said transformed data matrix by said filter coefficients in the row direction in order to provide filtered transformed data, that: (1) reduces the overshoot; (2) degrades the resolution; and (3) increases the signal-to-noise ratio;
   f) obtaining symmetrical data by complex conjugation of the filtered data matrix along the row direction which: (1) increases the amount of data and consequently improves the resolution, (2) compresses the overshoot causing the ringing artifacts, and (3) decreases the signal-to-noise ratio;
   g) Fourier transforming the symmetrical data in the row direction to obtain the image data; and
   h) processing the image data to obtain an image over the same number of scanned points in a comparable scan and processing time with reduced ringing artifacts and with relative resolution and relative signal-to-noise substantially equal to unity.

2. The method of claim 1 wherein steps d) and e) are interchanged.

3. The method of claim 1 wherein the step of analytically determining optimized values of controllable parameters $\alpha$ and R comprising the steps of:
   a) generating a table for each value of R that relates attenuation A between 22 and 50 db of the overshoot (by the filter) to: filter characteristics $\alpha$, relative signal-to-noise ratio and relative width of step response $\alpha$; and
   b) selecting the values of $\alpha$ and R from the tables to obtain the maximum attenuation of the overshoot while maintaining $\gamma$ and $\beta$ substantially equal to one.

4. The method of claim 3 including the step of determining the relative resolution $\gamma$ from the relative width of step response of the filtered data as compared to the step response of the unfiltered data using the equation:

$$\gamma = \frac{D'}{D_o}(1 - R)$$

where:
  $D'$ is the frequency width for the step response of the filter data,
  $D_O$ is the frequency width for the step response of the unfiltered data, and
  R is the sampling symmetry; i.e., the number of sampling points added by complex conjugation divided by the total number of points.

5. The method of claim 3 wherein the relative signal-to-noise ratio is calculated using the equation:

$$\beta = \left[ \frac{N_s}{\sum_{N_A} |f_k|^2 + 2 \sum_{N_{Z/2}} |f_k|^2} \right]^{\frac{1}{2}}$$

where:
  $N_A$ is the number of asymmetrical sampling,
  $N_Z$ is the number of sampling points acquired using symmetrical or asymmetrical sampling,
  $N_Z/2$ is the number of sampling points added by complex conjugation, and
  $f_k$ is the filter function for each $N_A$ point, where:

$$k = -(N_A-1)/2 \ldots 0 \ldots +(N_A-1)/2 \text{ and } f_k=1 \text{ for } k=0.$$

6. The method of claim 4 where the step function applied to determine the step response is:

$$S(f) = 2 \int_0^f F_T(f') df'$$

where $F_T(f')$ is the Fourier transform of the time domain filter $f_K$.

7. The method of claim 3 wherein a Kaiser filter is used.

8. The method of claim 7 including the step of analytically determining the characteristic $\alpha$ relative to the attenuation of the filter by using the equation:

$$\alpha = 0.5842(A-21)^{0.4} + 0.07886(A-21)$$

for attenuations A between 21 and 50 db.

9. The method of claim 1 wherein the step of multiplying the acquired signals by a filter comprises multiply k sampled points by $f_k$ where $k = -(N_A-1)/2 \ldots 0 \ldots (N_A-1)/2$ and $f_k = 1$ for $k=0$.

10. The method of claim 1 where the asymmetrical sampling is accomplished in the phase encoding direction.

11. The method of claim 1 where the asymmetrical sampling is accomplished in the frequency encoding direction which are the rows of the data matrix.

* * * * *